(12) United States Patent
Yang et al.

(10) Patent No.: US 9,195,533 B1
(45) Date of Patent: *Nov. 24, 2015

(54) ADDRESSING VARIATIONS IN BIT ERROR RATES AMONGST DATA STORAGE SEGMENTS

(71) Applicant: Seagate Technology LLC, Cupertino, CA (US)

(72) Inventors: Won Choul Yang, Kowloon Tong (HK); Shi Jung Kim, Sai Wan Ho (HK); Ju Yong Lee, Kowloon (HK); Clifford Jayson Bringas Camalig, Singapore (SG); Mui Chong Chai, Singapore (SG)

(73) Assignee: Seagate Technology LLC, Cupertino, CA (US)

( * ) Notice: Subject to any disclaimer, the term of this patent is extended or adjusted under 35 U.S.C. 154(b) by 96 days.

This patent is subject to a terminal disclaimer.

(21) Appl. No.: 14/039,012

(22) Filed: Sep. 27, 2013

Related U.S. Application Data

(63) Continuation-in-part of application No. 13/655,616, filed on Oct. 19, 2012, now Pat. No. 8,732,555.

(51) Int. Cl.
*G11C 29/00* (2006.01)
*G06F 11/07* (2006.01)

(52) U.S. Cl.
CPC .................................... *G06F 11/076* (2013.01)

(58) Field of Classification Search
CPC ..... G06F 11/16; G06F 11/10; G06F 11/1068; G06F 11/108; G06F 11/1072; G11C 16/0483; G11C 11/5628; G11C 16/3459; G01R 31/3171; G11B 5/3136; G11B 5/40; G11B 5/455; G11B 20/1816; G11B 27/36; G11B 2005/001; G11B 2220/2516; G11B 5/314; G11B 5/55

USPC ........................................ 714/769, 763, 773
See application file for complete search history.

(56) References Cited

U.S. PATENT DOCUMENTS

| | | | |
|---|---|---|---|
| 6,215,831 B1 | 4/2001 | Nowack et al. | |
| 7,212,361 B1* | 5/2007 | Pederson et al. | 360/31 |
| 7,343,083 B2 | 3/2008 | Mishima et al. | |
| 7,375,914 B1* | 5/2008 | Dieron et al. | 360/75 |
| 8,031,423 B1 | 10/2011 | Tsai et al. | |
| 2006/0153307 A1 | 7/2006 | Brown et al. | |
| 2008/0165446 A1* | 7/2008 | Partee | 360/75 |
| 2008/0239560 A1* | 10/2008 | Yakuwa et al. | 360/77.14 |
| 2009/0091990 A1* | 4/2009 | Park et al. | 365/189.011 |

(Continued)

FOREIGN PATENT DOCUMENTS

EP 2595154 5/2013

OTHER PUBLICATIONS

Office Action from the United States Patent and Trademark Office dated Jul. 10, 2013 for U.S. Appl. No. 13/655,616.

*Primary Examiner* — Guerrier Merant
(74) *Attorney, Agent, or Firm* — Westman, Champlin & Koehler, P.A.

(57) ABSTRACT

The disclosure is related to an apparatus and methods for addressing variations in bit error rates amongst data storage segments. In a particular embodiment, an apparatus includes a controller that detects variations in bit error rates amongst different segments of a plurality of segments in a storage medium. The controller also adjusts a read/write operation parameter according to the detected variations amongst the bit error rates in the plurality of segments.

19 Claims, 16 Drawing Sheets

(56) References Cited

U.S. PATENT DOCUMENTS

| | | | |
|---|---|---|---|
| 2011/0075478 A1* | 3/2011 | Yoon et al. | 365/185.03 |
| 2011/0216590 A1* | 9/2011 | Eun et al. | 365/185.03 |
| 2012/0050907 A1 | 3/2012 | Haapala | |
| 2012/0224420 A1* | 9/2012 | Sakurada et al. | 365/185.03 |
| 2012/0311406 A1* | 12/2012 | Ratnam et al. | 714/768 |
| 2013/0027801 A1 | 1/2013 | Kumar et al. | |
| 2014/0281820 A1* | 9/2014 | Alrod et al. | 714/773 |

\* cited by examiner

ADDRESSING VARIATIONS IN BIT ERROR RATES AMONGST DATA STORAGE SEGMENTS

CROSS REFERENCE TO RELATED APPLICATION

The present application is a continuation-in-part of and claims priority of U.S. patent application Ser. No. 13/655,616, filed Oct. 19, 2012, the content of which is hereby incorporated by reference in its entirety.

SUMMARY

In a first embodiment, an apparatus is disclosed. The apparatus includes a controller device that determines a topographical profile and a bit error rate profile of a data storage medium. The controller device utilizes a correlation function to determine whether the topographical profile and the bit error rate profile correspond. The controller device also detects at least one of topographical variations or variations in bit error rates amongst different segments of a plurality of segments in the data storage medium when the topographical profile and the bit error rate profile correspond. The controller device then adjusts a read/write operation parameter according to the detected at least one of the topographical variations or the variations in the bit error rates amongst the plurality of segments to control bit error rates of the plurality of segments.

In a second embodiment, a data storage device is disclosed. The device includes a storage element divided into a plurality of segments. The device also includes a controller device that determines a topographical profile and a bit error rate profile of the storage element. The controller device utilizes a correlation function to determine whether the topographical profile and the bit error rate profile correspond. The controller device also detects variations in bit error rates amongst different segments of a plurality of segments in the storage element when the topographical profile and the bit error rate profile correspond. The controller device then adjusts a read/write operation parameter according to the detected variations amongst the bit error rates in the plurality of segments.

In a third embodiment, another apparatus is disclosed. The apparatus includes a controller that detects variations in bit error rates amongst different segments of a plurality of segments in a storage medium. The controller also adjusts a read/write operation parameter according to the detected variations amongst the bit error rates in the plurality of segments.

Other features and benefits that characterize disclosed aspects will be apparent upon reading the following detailed description and review of the associated drawings.

DETAILED DESCRIPTION OF ILLUSTRATIVE EMBODIMENTS

In the following detailed description of the embodiments, reference is made to the accompanying drawings which form a part hereof, and in which are shown by way of illustration of specific embodiments. It is to be understood that other embodiments may be utilized and structural changes may be made without departing from the scope of the present disclosure.

Embodiments described below address variations in bit error rates amongst data storage segments in disc drives, solid state memories, etc.

Surfaces of discs employed in disc drives can include irregularities in surface roughness, uneven coercivity, irregular flatness, waviness, etc. Solid state memories can also include manufacturing irregularities, differences in wear levels amongst different areas of the memory, etc. Such irregularities may result in read/write errors, which impact bit error rates.

Figure 1:
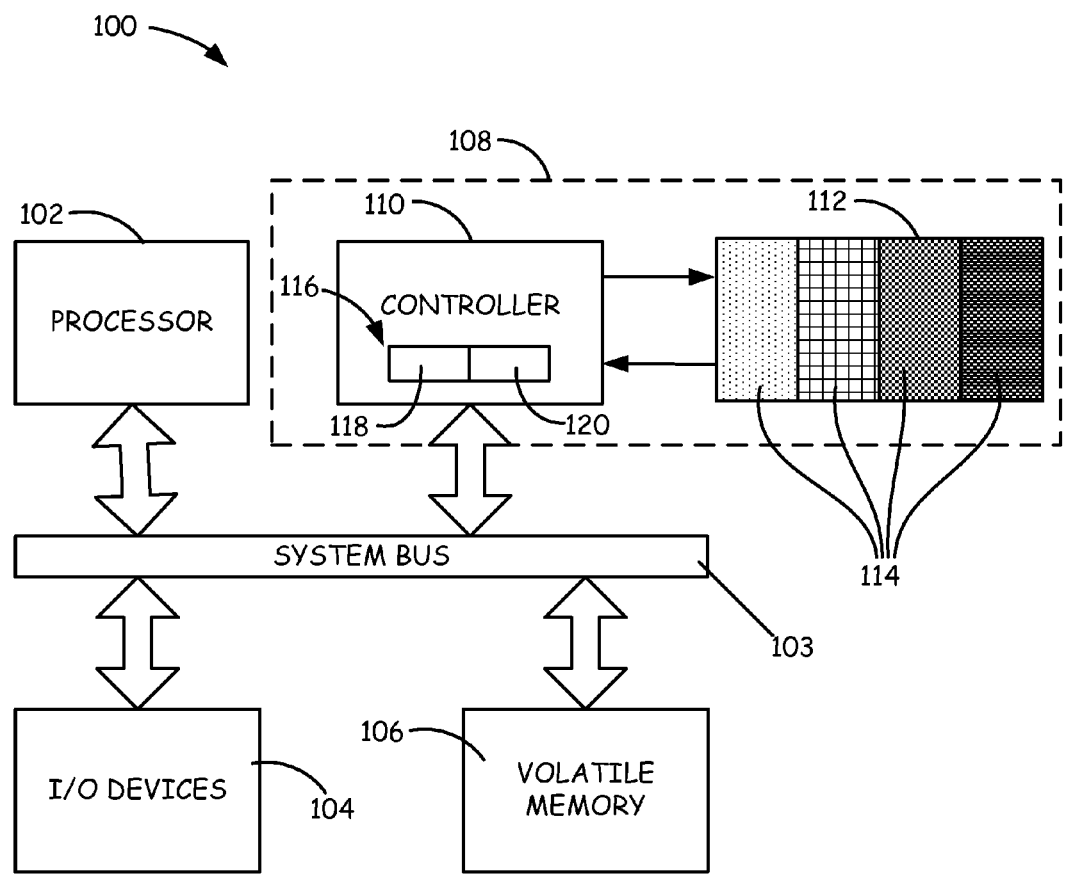
FIG. 1 is a diagram of an illustrative embodiment of a system of memory management that adjusts one or more read/write operation parameters according to detected variations amongst bit error rates of segments of a storage element.

Referring to FIG. 1, a particular embodiment of a system of memory management is shown and generally designated 100. The system of memory management 100 may include a processor 102 connected to a system bus 103 which also can be connected to input/output (I/O) devices 104, such as a keyboard, monitor, modem, storage device, or pointing device. The system bus 103 may also be coupled to a memory 106, which may be a random access volatile memory, such as dynamic random access memory (DRAM). The system bus may also be coupled to a data storage device 108.

The data storage device 108 may include a controller 110, which may be coupled to the processor 102 via a connection through the system bus 103. The data storage device 108 may also contain a storage element 112.

As used herein, a storage element/storage medium refers to a non-transitory computer-readable data storage element/medium that is tangible. Thus, in exemplary embodiments, storage element 112 can include different categories of digital media that may be used in computer storage devices.

In some embodiments, storage element/storage medium 112 may include, for example, a magnetic storage medium (for example, a magnetic data storage disc), an optical storage medium (for example, an optical data storage disc), etc. Specific examples of disc storage media are provided further below.

In other embodiments, storage element/storage medium 112 may be a memory such as a solid state memory, which may be any transistorized, semiconductor or thin film memory that contains no moving mechanical parts. An example of a solid state memory is a flash memory. Flash memories may include, for example, one-transistor memory cells that allow for high memory densities, high reliability, and low power consumption. Changes in threshold voltage of the cells, through programming of charge storage or trapping layers or other physical phenomena, determine the data value of each cell. Cells in a flash memory chip are organized into blocks and each block typically contains multiple pages. Other types of solid state memories may have a similar organization. Storage element 112 may include a flash memory or any other type of solid state memory. It should be noted that storage element 112 may also include any suitable combination of magnetic storage media, optical storage media, solid state memory devices, etc.

During operation, the processor 102 may send a command and data to the data storage device 108 to retrieve or store data. The controller 110 can receive the command and data from the processor 102 and then manage the execution of the command to store or retrieve data from the memory 112.

As noted earlier, storage media surfaces can include irregularities in surface roughness, uneven coercivity, irregular flatness, waviness, etc. Also, solid state memories can include manufacturing irregularities, differences in wear levels amongst different areas of the memory, etc. As can be seen in FIG. 1, storage element 112 is divided into multiple segments 114. Different ones of memory segments 114 may be of different sizes and may include different irregularities and irregularity levels. Due to differences in irregularities and irregularity levels amongst segments 114, when controller 110 writes data to, and reads data from, all of segments 114 using same values of read/write parameters, bit error rates can sometimes differ substantially amongst the different segments 114. To address variations in bit error rates amongst segments 114, controller 110 is configured to adjust one or more read/write operation parameters according to the detected variations amongst the bit error rates in the segments 114.

If storage element 112 is a solid state memory, in some embodiments, segments 114 can be analogous to sub-blocks or pages of solid state memory cells. Of course, in different embodiments, any suitable number (one or more) of sub-blocks or blocks may constitute a segment 114. If storage element 112 is a solid state memory, controller 110 may be configured to adjust, for example, a write current value employed to write data to a particular one of segments 114 according to a previously detected bit error rate for that particular segment of segments 114. In certain embodiments, controller 110 includes a parameter memory 116 that is configured to store a table that includes segments identifiers 118 and corresponding segment write current values 120. In general, element 120 represents values of any suitable read/write parameter that can be adjusted to address variations in bit error rates amongst segments 114. In one embodiment, controller 110 applies write currents to the segments 114 in accordance with the entries in the table in the parameter memory 116. It should be noted that, although parameter memory 116 is shown within controller 110, it may instead be positioned outside controller 110. Controller 110 only needs to be able to communicate with memory 116 using any suitable wired or wireless communication technique. In other embodiments, parameters other than write current may be adjusted.

If data storage device 108 is a disc drive and storage element 112 is a portion of a data storage disc, controller 110 manages read/write operations by, for example, controlling a head that communicates with the data storage disc. The head is supported by, for example, an air bearing slider that carries the head and appropriately positions the head above a rotating disc. The slider typically "flies" above the disc at ultra-low fly heights. The fly height or head-media spacing (HMS) is the gap between the head and the disc. In such an embodiment, controller 110 may be configured to employ different head-media spacings for different ones of segments 114 based on the detected variations amongst the bit error rates in the segments 114. In such embodiments, parameter memory 116 may include a table that contains segment identifiers 118 and corresponding different head-media spacing values 120. As noted above, in general, element 120 represents values of any suitable read/write parameter that can be adjusted to address variations in bit error rates amongst segments 114. In other embodiments, parameters other than head-media spacing may be adjusted. Details regarding certain disc drive embodiments are provided below.

Figure 2:
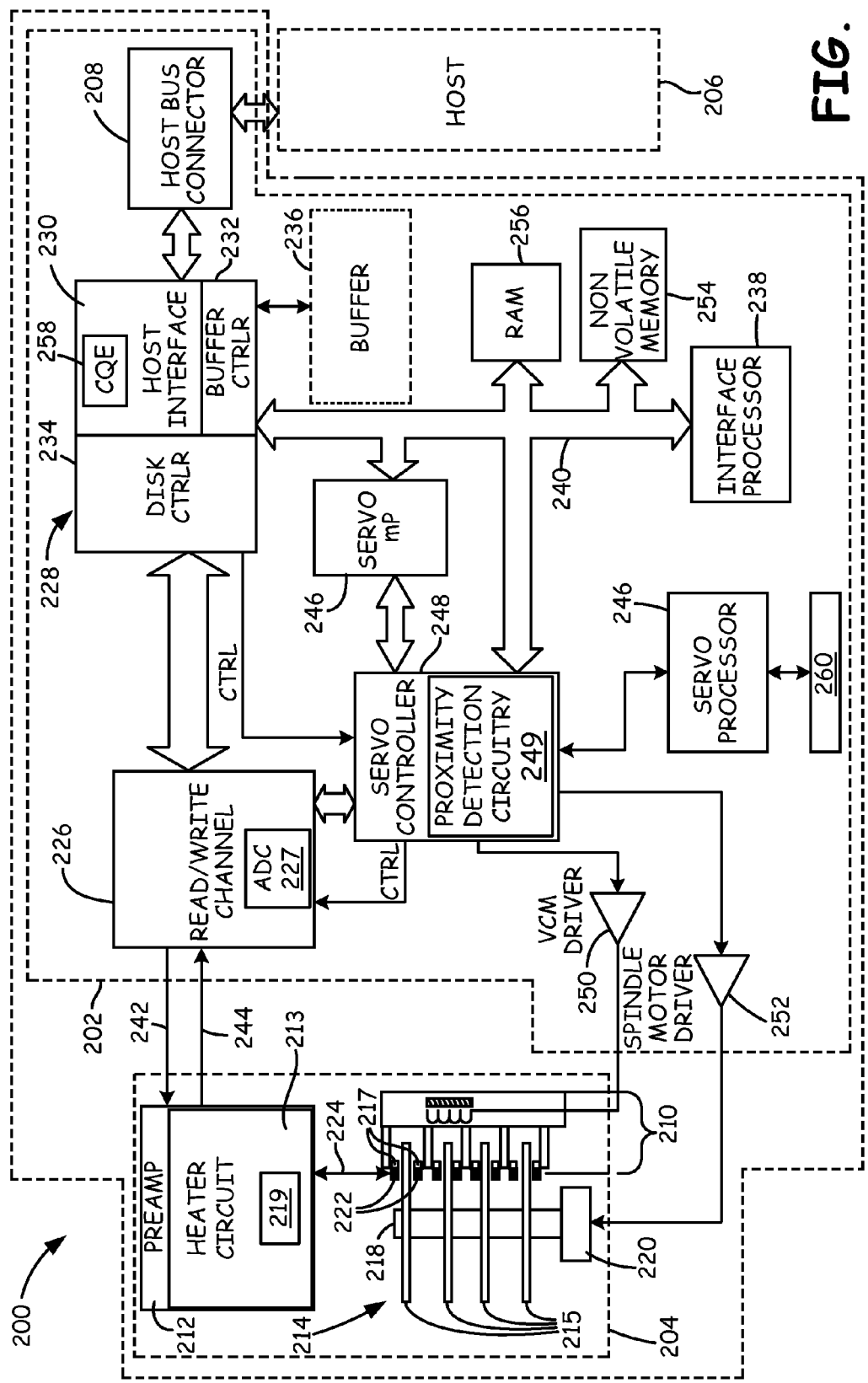
FIG. 2 is a block diagram of a disc drive in accordance with one embodiment.

Referring now to FIG. 2, a specific exemplary embodiment of a disc drive data storage system in which head-media spacings may be adjusted based on variations in bit error rates amongst different disc segments, is shown. Disc storage system 200 includes a printed circuit board assembly (PCBA) 202 and a head-disc assembly (HDA) 204. PCBA 202 includes circuitry and processors, which provide a target interface controller (or drive controller) for communicating between a host system 206 and HDA 204. Host system 206 can include a microprocessor-based data processing system such as a personal computer or other system capable of performing a sequence of logical operations. Data is transmitted between host system 206 and PCBA 202 via a host bus connector 208. HDA 204 includes an actuator assembly 210, a preamplifier 212, and a disc assembly 214. Disc assembly 214 includes one or more media discs 215, stacked on a spindle assembly 218. Spindle assembly 218 is mechanically coupled to a spindle motor 220 for rotating the disc(s) at a high rate of speed.

Actuator assembly 210 includes a voice coil motor, and multiple actuator arms. Located at the end of each actuator arm are one or more sliders/transducer heads such as 222, which are associated with a respective disc surface. Transducer heads 222 communicate with disc controller circuit board 202 via a cable assembly 224 connected to preamplifier 212 for reading and writing data to the transducer head's associated disc surface. Preamplifier 212 provides an amplified signal to a read/write channel 226 of PCBA 202. Read/write channel 226 performs encoding and decoding of data written to and read from the disc.

A servo processor 246 provides intelligent control of actuator assembly 210 and spindle motor 220 through a servo controller 248. By commands issued to servo controller 248 by servo processor 246, VCM driver 250 is coupled to move actuator assembly 210 and spindle motor driver 252 is coupled to maintain a constant spin rate of spindle motor 220.

PCBA 202 includes a host interface disc controller (HIDC) application-specific integrated circuit (ASIC) 228. ASIC 228 includes a host interface 230, a buffer controller 232, and a disc controller 234. Host interface 230 communicates with host system 206 via host bus connector 208 by receiving commands and data from and transmitting status and data back to host system 206. A command queuing engine (CQE) 258 is incorporated in host interface 230.

Buffer controller 232 controls a non-volatile buffer memory 236. Disc controller 234 tracks the timing of data sectors passing under a currently selected transducer head and accordingly sends data to and receives data from read/write channel 226. Disc controller 234 also provides for error correction and error detection on data transmitted to and read from discs 214.

An interface processor 238 manages a queue of commands received from host 206 with the assistance of the CQE 258 embedded in host interface 230. Interface processor 238 interfaces with functional elements of PCBA 202 over a bus 240, for transfer of commands, data, and status.

Disc system operational programs may be stored in non-volatile program storage memory 254, such as read-only memory (ROM) or flash memory, and are loaded into random access memory (RAM) or program loading memory 256 for execution by interface processor 238. Suitably, servo processor 246 may have integrated or separate memory 260 for storage of servo programs.

As mentioned above, preamplifier 212 provides an amplified signal to a read/write channel 226 of PCBA 202. Further, preamplifier 112 includes head-media spacing or fly height control circuitry and associated head-heating circuitry 213. In accordance with some embodiments, head heating circuitry 213 can provide an AC injection signal to heaters 217 in the sliders/heads 222. In some embodiments, applying an AC injection signal with the help of head heating circuitry 213 involves varying digital to analog converter (DAC) values in a register 219 included in, or coupled to, the head heating circuitry 213. In certain embodiments, register 219 includes a table that contains identifiers for different segments on discs 215 and corresponding different heater DAC values. In one embodiment, the heater DAC values are varied synchronous to the segments. Details of a disc surface divided into segments are provided below in connection with FIG. 3.

Figure 3:
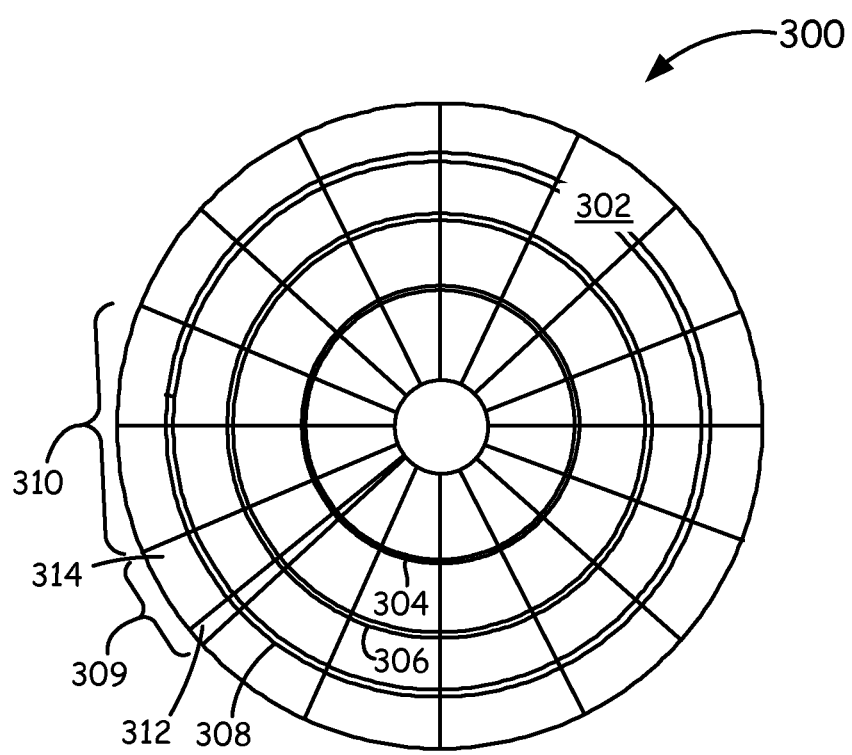
FIG. 3 is a diagrammatic representation of a simplified top view of a disc included in the disc drive of FIG. 2.

FIG. 3 is a diagrammatic representation of a simplified top view of a disc 300 having a surface 302 which may be used in conjunction with a sectored servo system (also known as an embedded servo system) according to a specific example. Disc 300 can be, for example, a single disc of disc pack 214 of FIG. 2. As illustrated in FIG. 3, disc 300 includes a plurality of concentric tracks 304, 306 and 308 for storing data on the disc's surface 302. Although FIG. 3 only shows a small number of tracks (i.e., 3) for ease of illustration, it should be appreciated that typically many thousands of tracks are included on the surface 302 of disc 300.

Each track 304, 306 and 308 is divided into a plurality of sectors 309. Each of sectors 309 are typically divided into a servo portion 312 and a data storage portion 314. In the interest of simplification, the servo and data storage portions are shown in only one sector. In the embodiment shown in FIG. 3, sectors 309 are grouped into segments 310. Specifically, each segment 310 includes two sectors 309. However, different embodiments can have segments 310 that have any suitable number of sectors 309, which can include a single sector or a plurality of sectors. Also, in some embodiments, each of sectors 309 may be divided into multiple segments. Further, in some embodiments, different ones of segments 310 on disc surface 302 can have different sizes (i.e., each different segment 310 can include a different number of sectors 309). As noted above, different segments 310 can have different bit error rates due to differences in irregularities and irregularity levels amongst segments 310. Details regarding determining differences in bit error rates amongst segments 310 and adjusting head-media spacings to address the determined differences in bit error rates amongst segments 310 are provided below in connection with FIG. 4.

Figure 4:
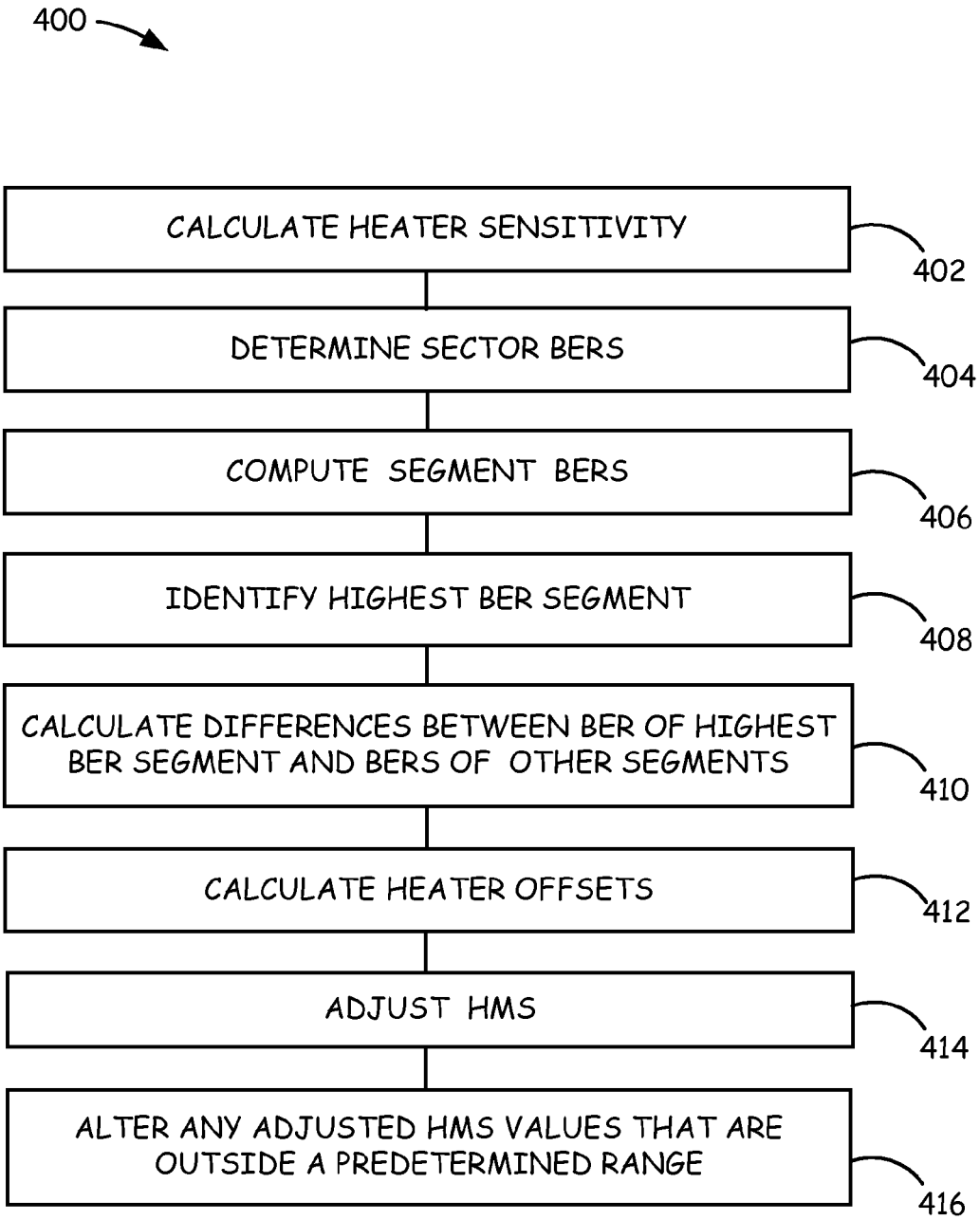
FIG. 4 is a simplified flow diagram of a method embodiment.

FIG. 4 is a flow diagram 400 of a method embodiment, which can be carried out by disc controller 234 (of FIG. 2), for example. At step 402, a sensitivity of a heater that is thermally coupled to a thermally-actuated head is calculated. In one embodiment, heater sensitivity is measured by dividing a change in a heater DAC value by a corresponding change in a bit error rate (BER). At step 404, sector bit error rates (BERs) for individual ones of a plurality of sectors on a disc surface are determined. At step 406, bit error rates of segments on the disc surface are computed from the sector bit error rates. At step 408, a segment of the plurality of segments having a highest bit error rate of the bit error rates of the segments is identified. It should noted that, in this disclosure, a "highest bit error rate" is a "best" bit error rate and is an absolute bit error rate value. At step 410, differences between the highest bit error rate and the bit error rates of the segments of the plurality of segments other than the segment with the highest bit error rate are calculated. At step 412, heater segment offsets, which are products of the sensitivity of the heater and the differences between the highest bit error rate and the bit error rates of the segments of the plurality of segments other that the segment with the highest bit error rate, are calculated. At step 414, head-media spacings at different ones of the segments of the plurality of segments other that the segment with the highest bit error rate are adjusted based on respective ones of the calculated heater segment offsets. In some embodiments, the adjustments based on respective ones of the calculated heater segment offsets involve adjusting the heater DAC values in register 219 (or FIG. 2). In certain embodiments, before adjusting head-media spacings at different ones of the segments of the plurality of segments other that the segment with the highest bit error rate, a determination is made as to whether the adjustments would result in any head-disc interference or contact. Thus, a determination is made, at step 416, as to whether the adjustments would result in head-media spacing values that are within a predetermined range or predetermined limits for head-media spacing. At this step, suitable alterations to the adjusted heater values may be made if the adjusted heater values would result in head-media spacing values that are outside the predetermined range. It should be noted that step 416 may be optional in some embodiments.

In some embodiments, at least some of the steps shown in FIG. 4 and described above are carried out for one track in each zone of a disc surface such as 302 (of FIG. 3). For example, each of tracks 304, 306 and 308 (of FIG. 3) may belong to a different zone on disc surface 302 and at least some of the steps of FIG. 4 may be carried out for each of each of tracks 304, 306 and 308 (of FIG. 3). In general, at least some of the steps shown in FIG. 4 and described above may be carried out for any suitable number of tracks. In some embodiments, the steps of FIG. 4 are carried out during drive calibration at the time of manufacture of the drive. In other embodiments, one or more of the steps of FIG. 4 may be carried out after drive calibration in the field. Table 1 below shows different calculated values obtained using the above-described method steps.

TABLE 1

| Segment Number | Number of Sectors | Track Number | Segment BER | Target BER | Delta Segment BER | Heater Segment Offset |
|---|---|---|---|---|---|---|
| 1 | 60 | 0 | 2.7024 | 2.8286 | 0.1263 | 4 |
| 2 | 27 | 0 | 2.7900 | 2.8286 | 0.0386 | 0 |
| 3 | 123 | 0 | 2.5078 | 2.8286 | 0.3208 | 11 |
| 4 | 111 | 0 | 2.8286 | 2.8286 | 0.0000 | 0 |

In Table 1, the target BER (bit error rate) is a highest segment BER, delta segment BER is a difference between the target and segment BER, and heater segment offset is a product of heater sensitivity (step 402 of FIG. 4) and delta segment BER (step 410 of FIG. 4). A heater sensitivity value of 34.3 was used to obtain the above heater segment offset values.

This heater sensitivity value was obtained from a plot (not shown) of heater values versus corresponding bit error rate values. Specifically, a calculated value of a slope from the plot, which was 34.3, was used as the heater sensitivity value. The very small heater segment offset value for segment 2 was set to 0.

Figure 5:
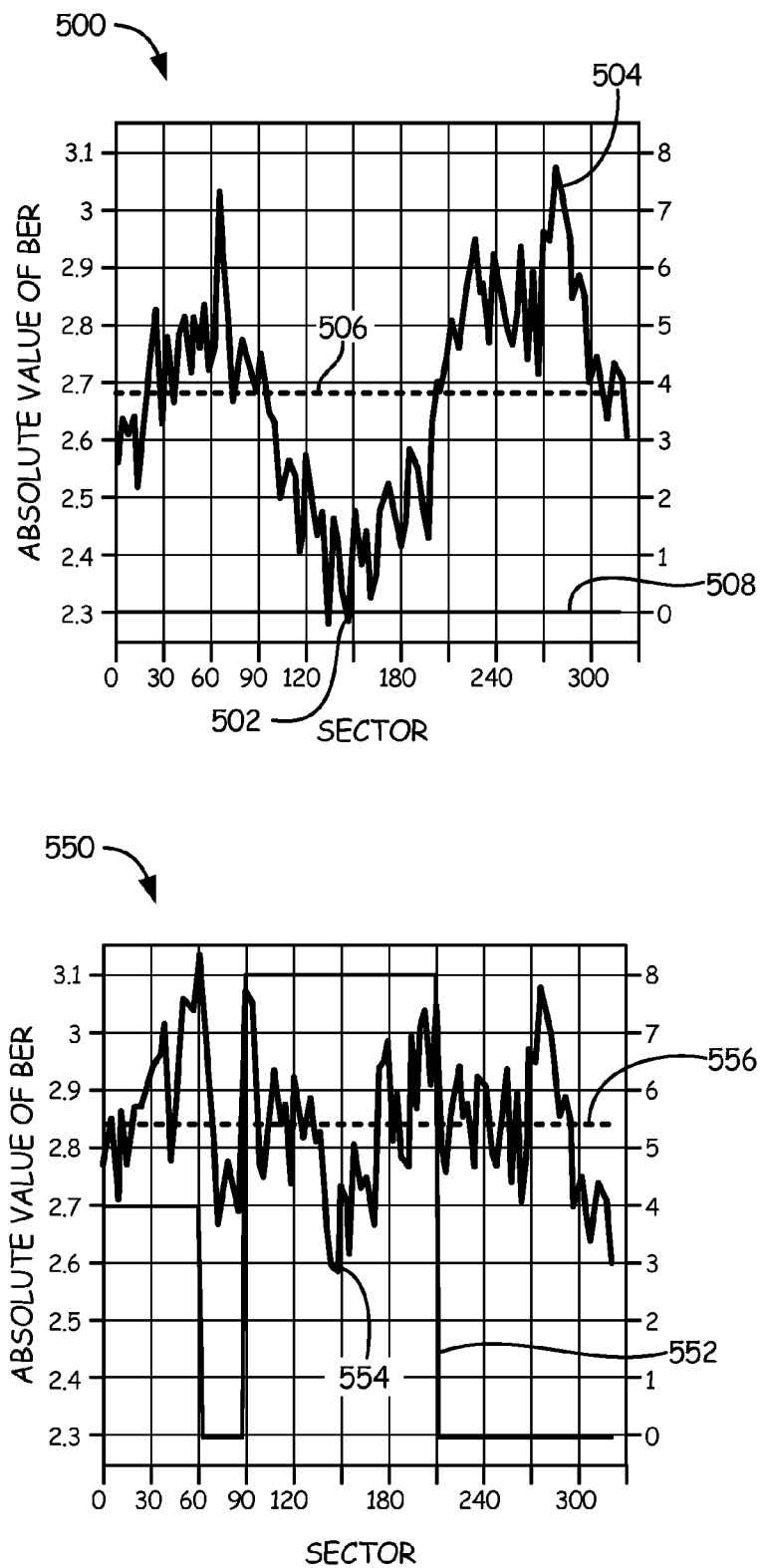
FIGS. 5 through 7 illustrate plots of experimental results.
Figure 6:
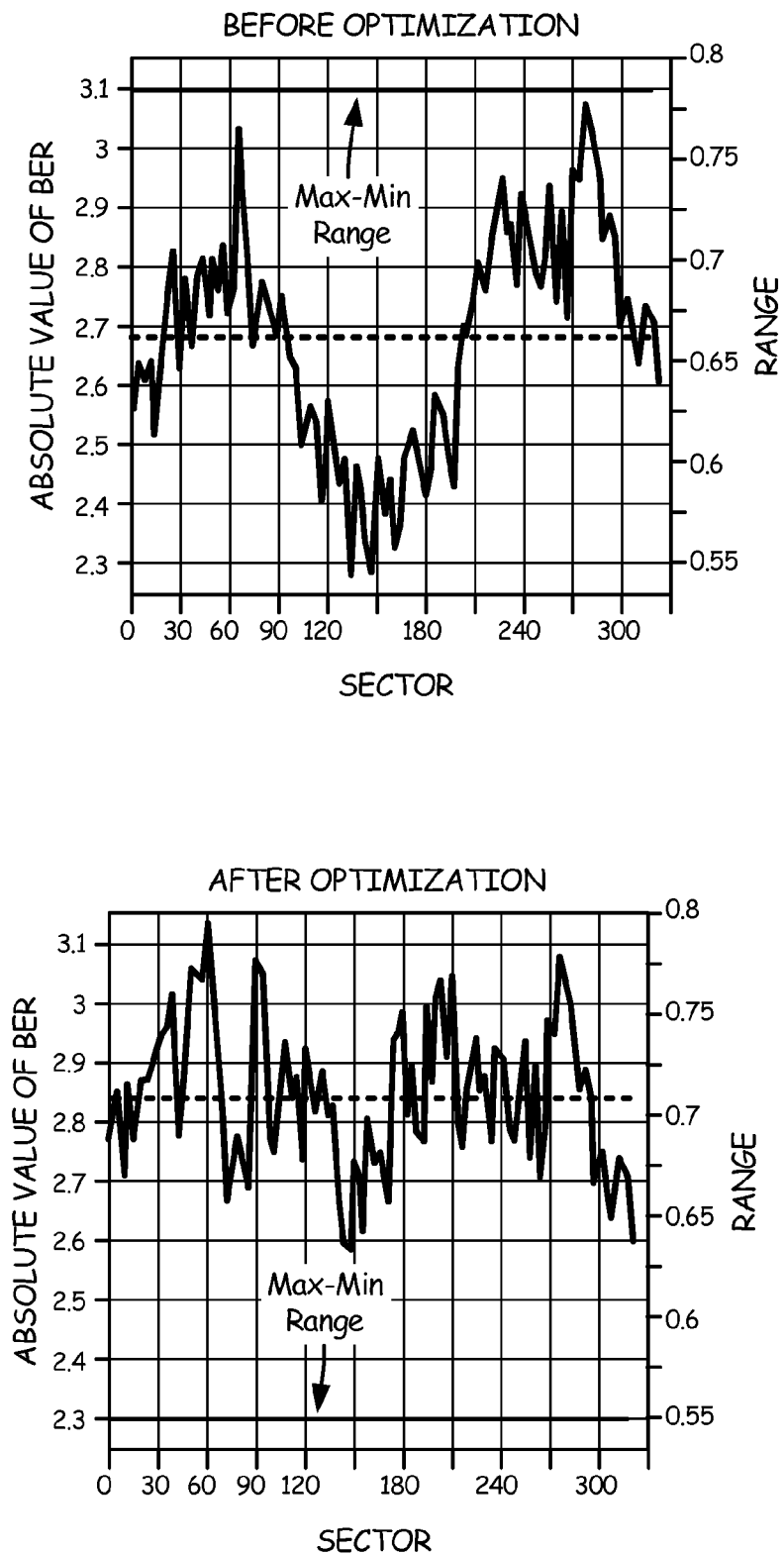
Figure 7:
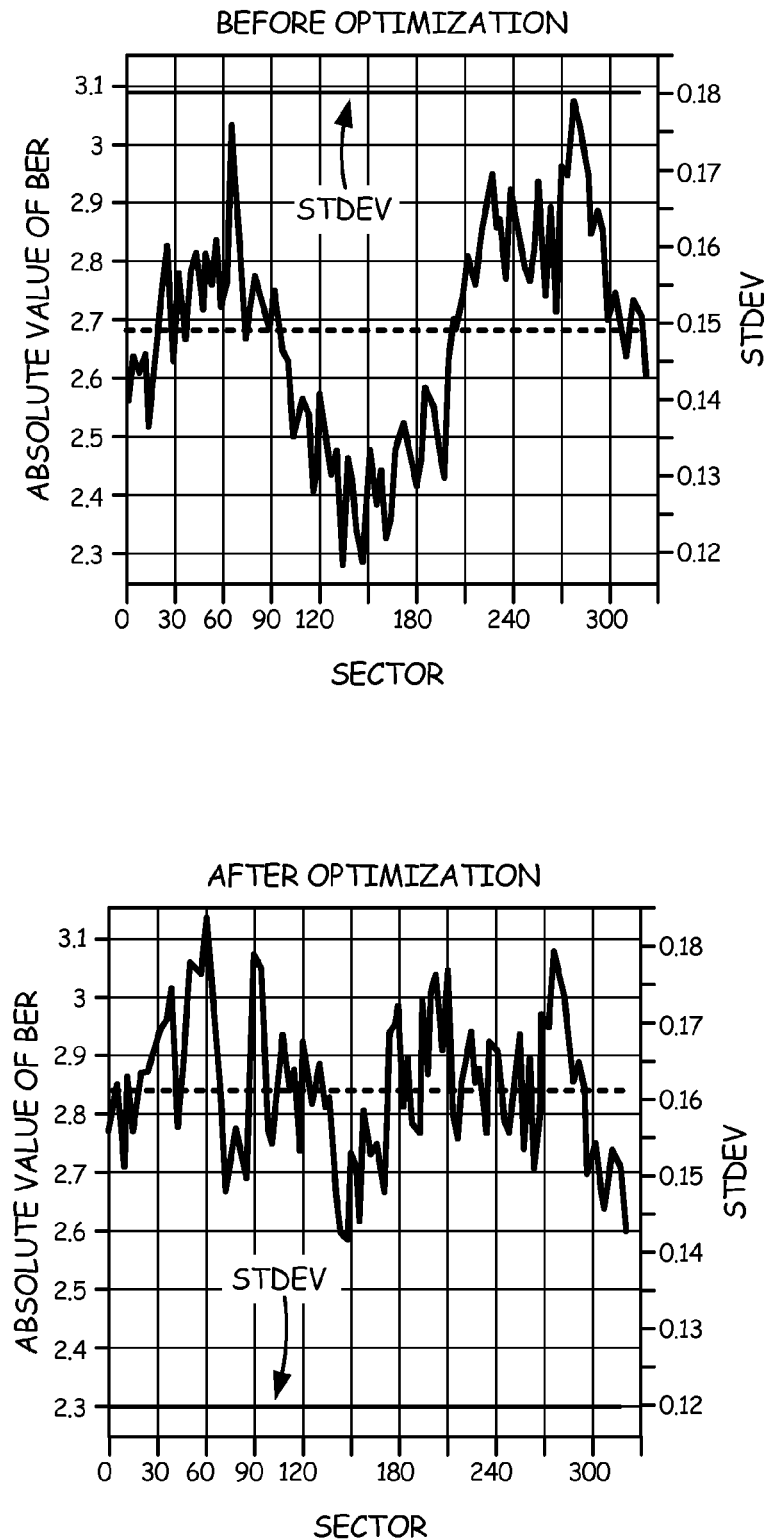

FIG. 5 includes plots that compare experimental data obtained without adjusting head-media spacings for different segments of a disc surface (i.e., before optimization) with data obtained after head-media spacings are adjusted for different segments of the disc (i.e., after optimization). Plots 500 represent data obtained before optimization and show a "valley" region 502 close to sector 150 where the sector bit error rate is 2.3. A peak bit error rate 504 of about 3.1 is approximately at sector 270. A mean bit error rate or track bit error rate, denoted by reference numeral 506, is 2.7, which is substantially better than the bit error rate in the valley region 502. It should be noted that a heater offset (HtrOffset) 508 is zero before optimization. Plots 550 represent data after optimization, which is the data included in Table 1 above. Plots 550 include four segments that correspond to the segments and sectors included in Table 1. As can be seen in plots 550, an adjusted heater offset 552 varies based on the different segments included in Table 1. Adjusted valley point 554 has a bit error rate of 2.6, which is a substantial improvement over the valley bit error rate of 2.3 before optimization (denoted by reference numeral 502). After optimization, a better track bit error rate of 2.85, denoted by reference numeral 556, is obtained. FIG. 6 includes plots that show that a sector error rate range (maximum sector BER value minus minimum sector BER value (Max-Min Range)) improves from 0.8 before optimization to 0.55 after optimization. FIG. 7 shows that a standard deviation for sector BER (STDEV) improves from 0.18 before optimization to 0.12 after optimization.

The above results demonstrate that the embodiments in the disclosure improve localized poor bit error rates by substantially equalizing sector error rates and enhancing overall track bit error rates.

Figure 8:
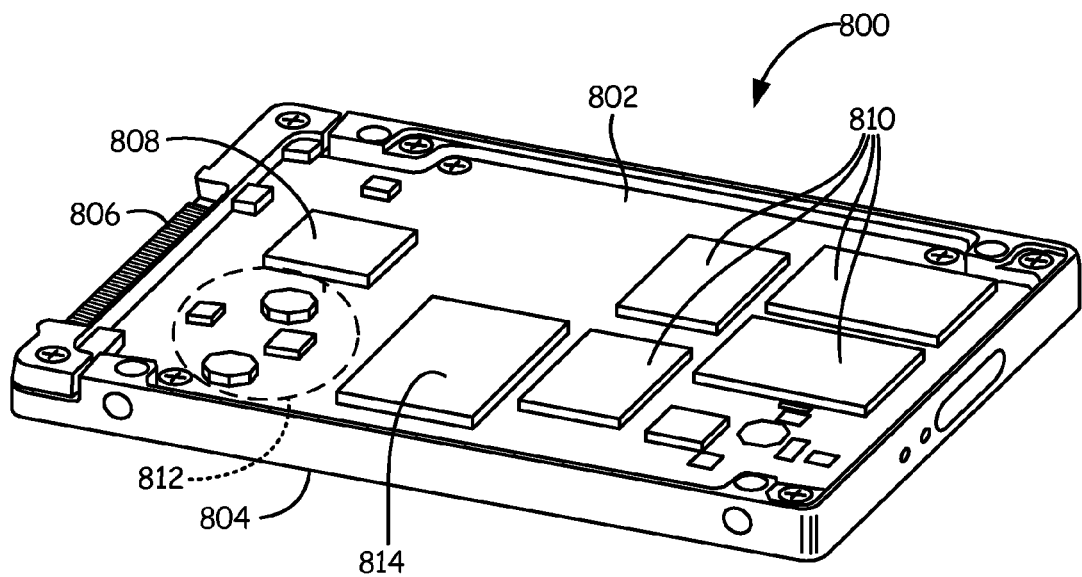
FIG. 8 is an isometric view of a solid-state drive in which aspects of different embodiments are implemented.

FIG. 8 illustrates an oblique view of a solid state drive (SSD) 800 in which the aspects of the above-disclosed embodiments are useful. SSD 800 includes one or more circuit card assemblies 802 and typically includes a protective, supportive housing 804, a top cover (not shown), and one or more interface connectors 806. SSD 800 further includes a controller ASIC 808, one or more nonvolatile memory devices 810, and power regulation circuitry 812. The nonvolatile memory devices 810 are essentially the SSD's data storage media. In some applications, SSD 800 further includes a power-backup energy storage device, such as a super-capacitor 814.

In accordance with certain aspects, the solid-state drive 800 includes a circuit card assembly 802 that includes a connector 806 for connection to a host computer. In accordance with certain aspects, the connector 816 includes a SAS, FC-AL, SCSI, PCI-E, IDE, AT, ATA, SATA, IEEE-1394, USB or other interface connector adapted for connection to a host. Write or read operation parameters that may be changed upon detecting bit error variations in different sectors of the memory include reference voltages, threshold voltages to differentiate values in cells, read voltages to detect the value of a cell, or write voltages to set the value of a cell.

In the above-described embodiments, a controller detects variations in BERs amongst different segments of a plurality of segments in a storage medium, and adjusts a read/write operation parameter according to the detected variations amongst the BERs in the plurality of segments.

The embodiments described below recognize that the BERs may vary due to topographical variations amongst data storage segments and may also vary amongst data storage segments due to variations in magnetic properties amongst the segments. Utilizing head heater offset values to adjust head-media spacing values over different segments in response to poor BERs in the different segments may improve BERs in certain ones of the different segments that have substantial topographical defects. However, adjusting head-media spacing values for segments that have substantially no topographical defects and only relatively poor magnetic properties, which contribute to the poor BERs, may produce undesirable results. For example, utilizing heater offset values to adjust head media spacing values for segments that have no substantial topographical defects may incorrectly produce adjusted head-media spacing values that could increase a likelihood of undesirable head-media contact.

The embodiments described below determine whether variations in BERs correspond with topographical defects/variations before adjusting one or more read/write operation parameters to control BERs.

Figure 9:
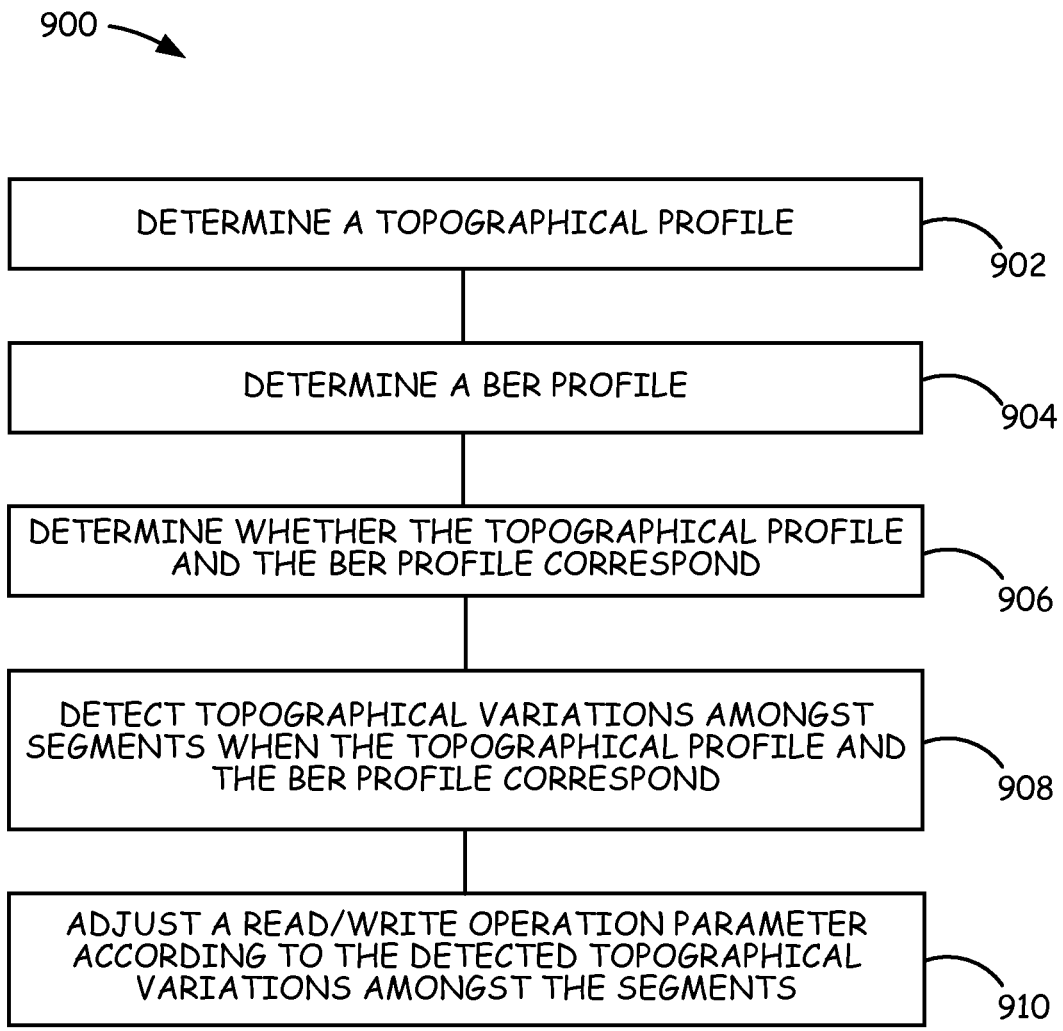
FIG. 9 is a simplified flow diagram of another method embodiment.

FIG. 9 is a flow diagram 900 of a method embodiment that controls BERs based on topographical or physical variations amongst segments in a data storage medium. In some embodiments this may include disc flatness or warpage. The method can be carried out by disc controller 234 (of FIG. 2), for example. At step 902, a topographical profile of a data storage medium is determined. A BER profile of the data storage medium is determined at step 904. At step 906, a correlation function is utilized to determine whether the topographical profile and the BER profile correspond. At step 908, topographical variations amongst different segments of a plurality of segments in the data storage medium are detected when the topographical profile and the BER profile correspond. At step 910, an operation parameter (in some embodiments, a read/write operation parameter) is adjusted according to the detected topographical variations amongst the plurality of segments to control BERs of the plurality of segments. The operation parameter to be adjusted may include a head to medium spacing, a fly height, a heater variable, or a write pole tip protrusion, among other parameters, in various embodiments.

Figure 10:
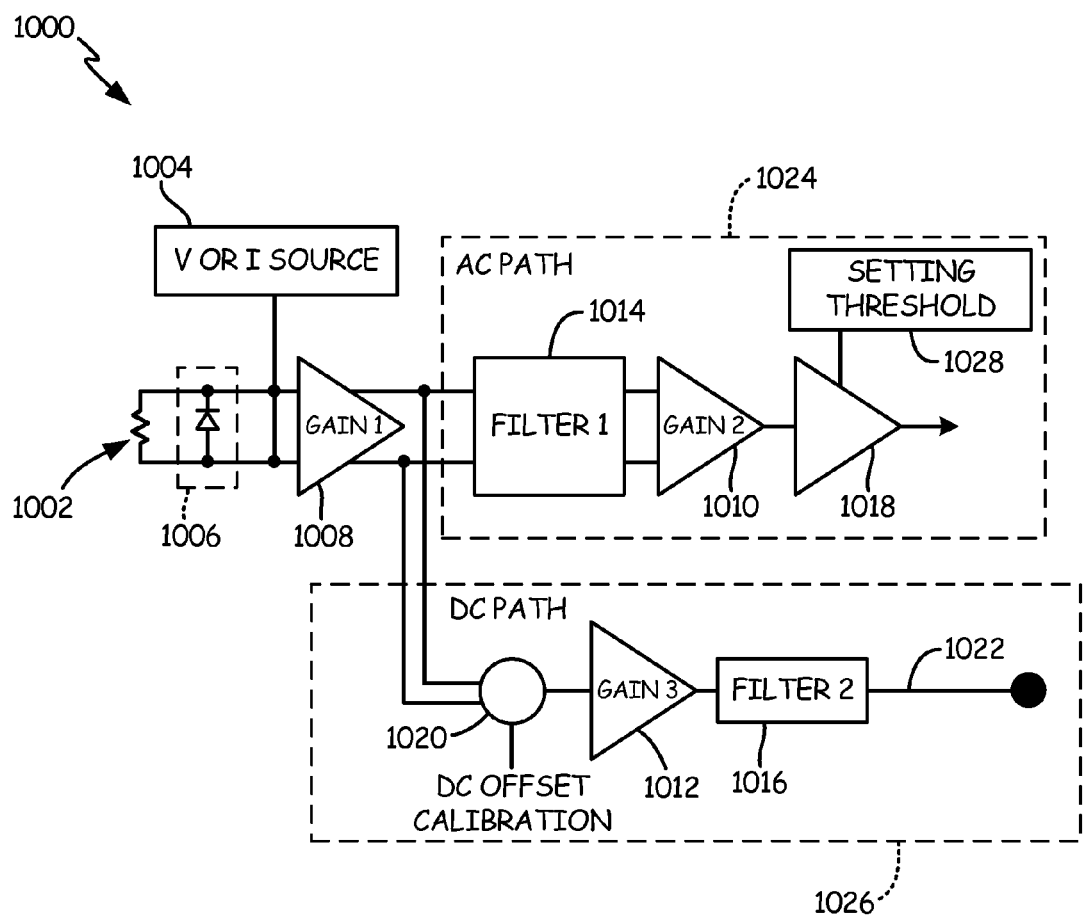
FIG. 10 illustrates a topography generation circuit in accordance with one embodiment.

FIG. 10 illustrates a topography generation circuit 1000 in accordance with one embodiment. Components of topography generation circuit 1000 may be included in HDA 204 (of FIG. 2). Topography generation circuit 1000 includes a topography sensor 1002, a power supply 1004, an over-current/over-voltage protection component 1006, a first amplifier 1008, a second amplifier 1010, a third amplifier 1012, a first filter 1014, a second filter 1016, a thermal asperity detection component 1018, a direct current (DC) offset calibrator 1020 and a DC output line 1022. As will be described further below, components 1014, 1010 and 1018 are coupled together to form an alternating current (AC) path 1024 for AC components of signals obtained from topography sensor 1002, and components 1020, 1012 and 1016 are coupled together to form a DC path 1026 for DC components of signals obtained from topography sensor 1002.

Topography sensor 1002 may be any suitable head-media proximity sensor. In one embodiment, the head-media proximity sensor 1002 is a thermal proximity sensor. In such an embodiment, as sensor 1002 moves relative to a data storage disc, for example, its instantaneous temperature changes as a function of instantaneous distance changes between sensor 1002 and the disc. If a protrusion on a surface of the disc causes the gap spacing to temporarily vary, or decrease, the temperature will cool and can be sensed as a momentary spike in an electrically monitored thermal response of sensor 1002. The amplitude of the spike is proportional to the temperature differential maintained in the sensor 1002 versus the disc surface and to the thermal properties of the protrusion, and depends on the instantaneous sensor-disc spacing (as opposed to a roughly average fly height). In a particular embodiment shown in FIG. 10, sensor 1002 is a differential ended temperature coefficient of resistivity (DETCR) sensor whose resistance automatically varies with temperature. Thus, in the embodiment of FIG. 10, topography sensor 1002 is represented by a variable resistor.

Power supply 1004 may be any current or voltage source suitable for use in a data storage device, for example. In some embodiments, power supply 1004 is a DC current or voltage source. In other embodiments, power supply 1004 may be an AC current or voltage source.

Component 1006, which is connected between topography sensor 1002 and power supply 1004 may be any suitable over-current/over-voltage protection component. In the embodiment of FIG. 10, component 1006 comprises one or more diodes connected across topography sensor 1002 such that, when there are current/voltage supply spikes, for example, the excess current is passed through the diode(s) instead of through topography sensor 1002.

First amplifier 1008, second amplifier 1010 and third amplifier 1012 many each comprise a suitable operational amplifier, with the respective operational amplifiers having gains represented by Gain1, Gain2 and Gain3 in the embodiment of FIG. 10. Also, thermal asperity detection component 1018 may comprise an operational amplifier having a suitable gain.

First filter 1014 may be a band-pass filter that attenuates signals outside a predetermined passband that covers a range of frequencies in which signals that are substantially suitable for thermal asperity detection are present. Band-pass filter 1014 may be a combination of a high-pass filter and a low-pass filter connected such that signals are first input into the high-pass filter, and the high-pass filter output is input into the low-pass filter, which provides the final band-pass filter output. Second filter 1016 may be a low-pass filter that passes low-frequency signals and attenuates frequencies higher than a predetermined cutoff frequency. DC offset calibrator 1020 may comprise any suitable element and/or module for carrying out DC offset calibration in DC path 1026. The DC offset calibration may involve adjusting (for example, reducing) an amplified output of DC components obtained from first amplifier 1008.

During operation of a data storage device that includes topography sensing circuit 1000, as sensor 1002 moves relative to a data storage disc, for example, changes in sensor resistance result in changes in electrical signals input to first amplifier 1008. As indicated above, output signals from amplifier 1008 are provided to both AC path 1024 and DC path 1026. In AC path 1024, signals received from amplifier 1008 are first input into first filter 1014, which, as noted above, passes AC signals having frequencies within a predetermined range. Signals output by first filter 1014 are provided to second amplifier 1010, which, in turn, provides an amplified output to thermal asperity detection component 1018. Thermal asperity detection component 1018 compares amplitudes of the received signals with a predetermined amplitude threshold for thermal asperity detection. This threshold is denoted by reference numeral 1028 in FIG. 10. If the amplitude of the signal(s) is greater than the predetermined threshold for thermal asperity detection, an output indicating the presence of a thermal asperity is provided to, for example, a control component such as disc controller 234 (of FIG. 2). Processing of thermal asperity-related outputs is outside the scope of the disclosure and therefore no further description regarding outputs of component 1018 is provided herein.

As noted above, the output of first amplifier 1008 is also provided to DC path 1026. In path 1026, DC offset calibration of the received signals is first carried out. The signals are then input into third amplifier 1012. The output of third amplifier 1012 is provided to second filter 1016. As noted above, second filter 1016 is a low pass filter that retains the DC component of the signal(s) in its output. The output of filter 1016 is obtained via DC output line 1022. The output obtained via DC output line 1022 corresponds to changes in DC resistance (DCR) of the DETCR. The output of DC path 1026 is therefore referred to herein as a DETCR DCR output.

DC output line 1022 is connected to an analog-to-digital converter (ADC) such as 227 (of FIG. 2) in a read/write channel such as 226 (of FIG. 2). The ADC 227 receives the analog DETCR DCR output from DC path 1026 and provides a digitized version of the DETCR DCR output. In some embodiments, digitization of the DETCR DCR output is synchronized with a servo interrupt service routine for each servo wedge. DETCR DCR resolution may be improved by optimizing Gain1/Gain3 and by proper DC offset calibration.

Figure 11:
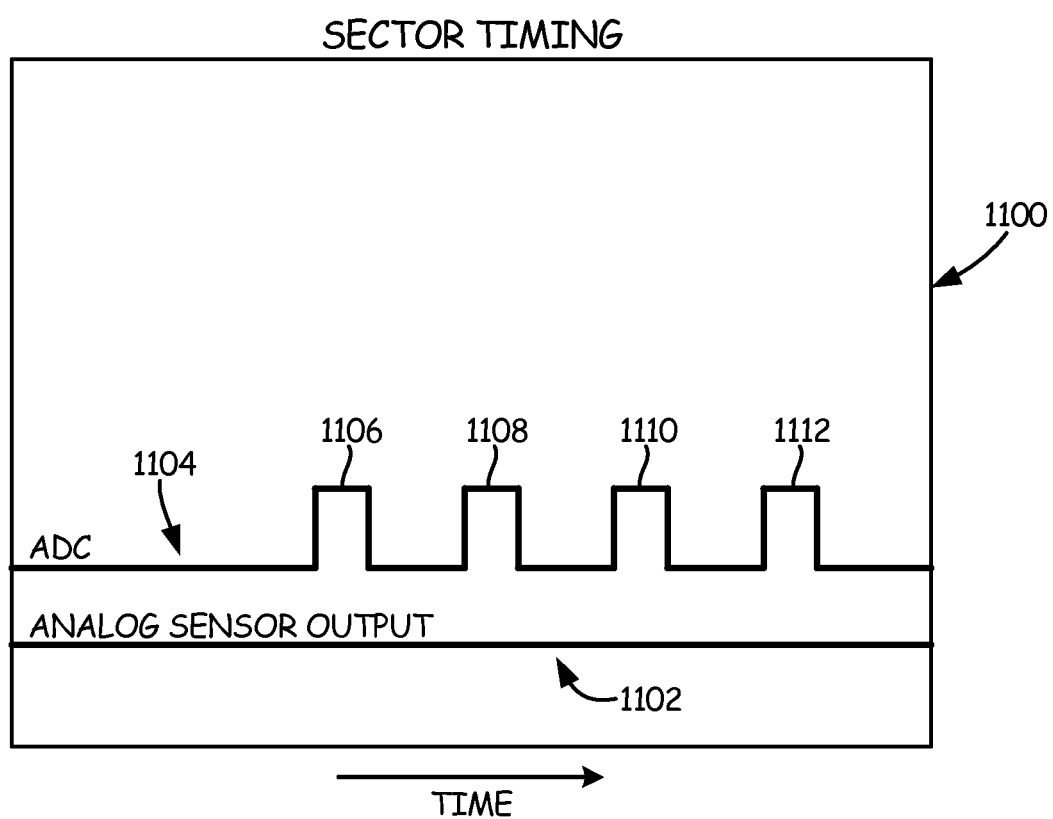
FIG. 11 illustrates a timing plot related to topographical data collection.

In different embodiments, multiple samples of the DETCR DCR output are taken in the read/write channel for each segment. In some embodiments, multiple samples of DETCR DCR output are taken in the read/write channel for each servo portion or servo wedge such as 312 (of FIG. 3). FIG. 11 includes a plot 1100 that illustrates ADC timing for a single servo wedge in which multiple samples of the DETCR DCR output are taken. Analog DETCR DCR output is represented by plot 1102. A digitized version of the analog DETCR DCR output is represented by plot 1104. In FIG. 11, four samples 1106, 1108, 1110 and 1112 of the analog DETCR DCR are taken per servo wedge.

Figure 12:
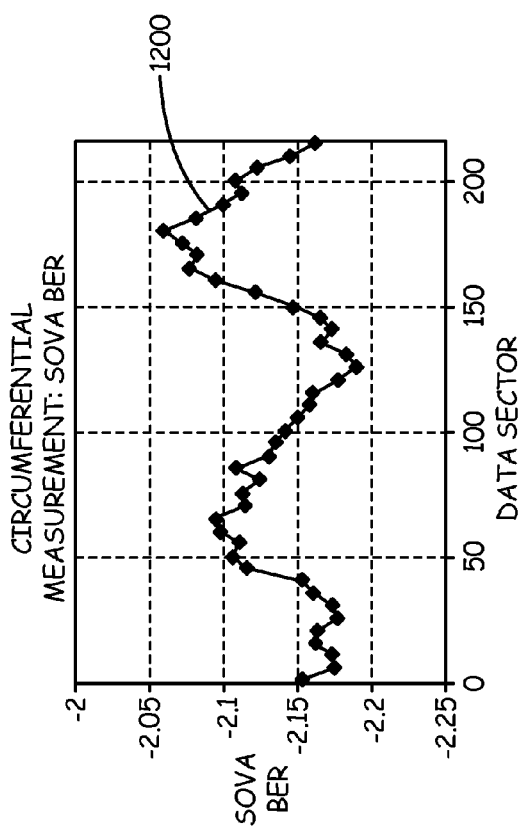
FIG. 12 illustrates bit error rate (BER) and topographical data plots.
Figure 12:
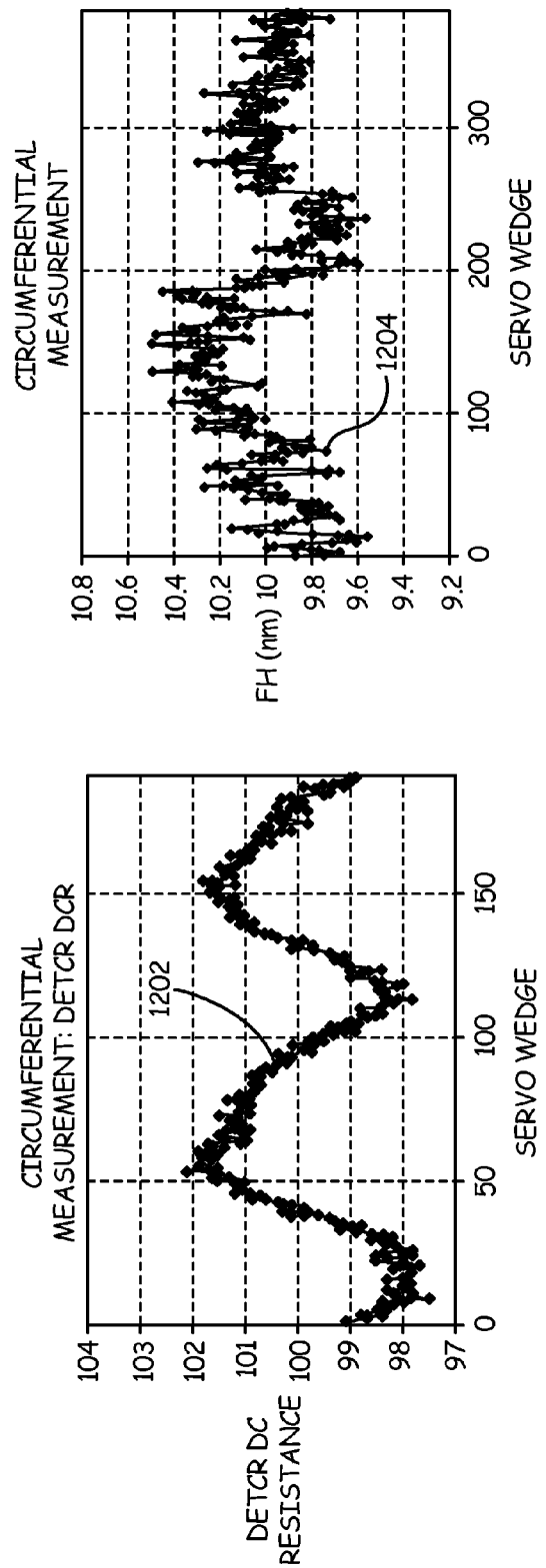

FIG. 12 illustrates a soft output Viterbi algorithm (SOVA) BER profile 1200, a DETCR DCR profile 1202 and a fly height (FH) profile 1204 over an entire disc revolution for one track. Data for profiles such as 1200, 1202 and 1204 may be obtained form a read/write channel such as 226 (of FIG. 2). As can be seen in FIG. 12, when FH is low at a particular servo wedge in plot 1204, the DETCR DCR value at the servo wedge in plot 1202 is also low. This is because, at low fly heights, the DETCR cools, thereby lowering the DCR. Also, a comparison of plots 1202 and 1204 shows the SOVA BER is higher at lower fly heights. However, as noted above, incorrectly decreased fly height values may result in undesirable head-media contact.

The embodiments described below in connection with FIGS. 13-16 employ a BER profile and a topographical profile (for example, a DETCR DCR profile) to avoid undesirable head-media contact, for example, in segments of a data storage medium.

Figure 13:
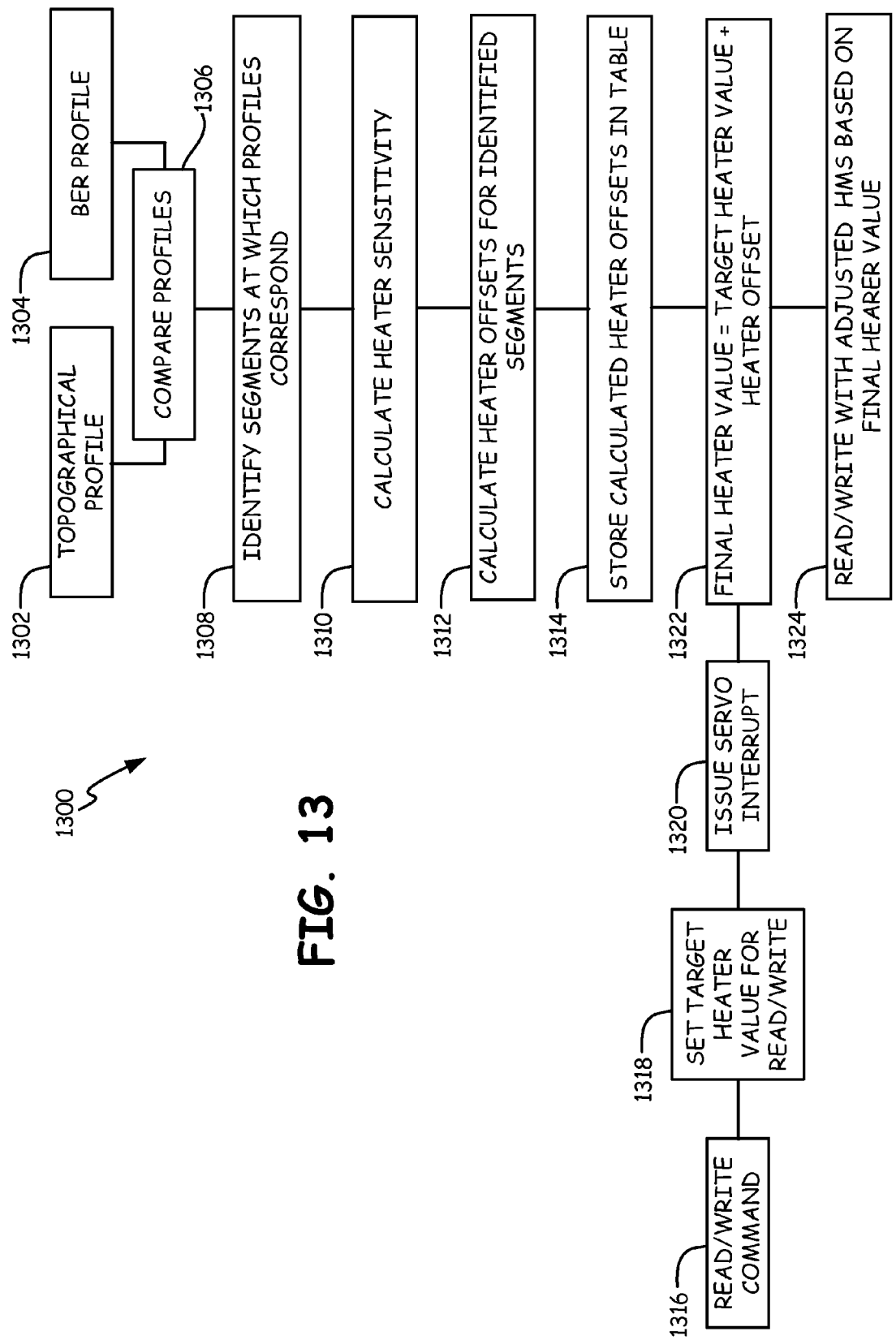
FIG. 13 is a flow diagram of a method embodiment that employs BER and topographical profiles.

FIG. 13 is a flow diagram 1300 of a method embodiment that employs both BER and topographical profiles. The method can be carried out by disc controller 234 (of FIG. 2), for example. At step 1302, a topographical profile of a data storage medium is obtained with the help of a topographical sensor such as 1002, incorporated in, for example, a thermally-actuated head, and other associated circuitry shown in FIGS. 2 and 10, for example. The topographical profile may be generated from DTCR DCR values obtained from different tracks in, for example, different zones on a surface of the data storage medium. At step 1304, a BER profile is obtained form data read from different tracks in, for example, different zones on the data storage medium. In some embodiments, the topographical and BER profiles are substantially simultaneously obtained from data obtained from a same set of tracks. At step 1306, the topographical profile and the BER profile are compared. At step 1308, segments at which the BER and topographical profiles correspond are identified. At step 1310, a sensitivity of a heater that is thermally coupled to the thermally-actuated head is calculated. In one embodiment, heater sensitivity is measured by dividing a change in a heater DAC value by a corresponding change in BER. At step 1312, heater segment offsets (for example, heater DAC correction values) for the identified segments are calculated. At step 1314, the heater segment offsets are stored in a table in, for example, register 219 of FIG. 2. During operation, the stored heater offset values are used to adjust head-media spacings for the identified segments. Steps 1316-1324 deal with the utilization of the calculated heater offsets during operation of the data storage device.

At step 1316, a read/write command is received in the data storage device. At step 1318, a target heater value (for example, a DAC value) is set for executing the read/write operation. At step 1320, a servo interrupt is issued at a servo sector. At step 1322, a final heater value is calculated for the servo sector. If the servo sector is not of one of the identified segments/sectors for which heater offsets are calculated, the final heater value for the sector is simply the target value. If the sector is one of the identified sectors, the calculated heater offset for that sector is added to the target heater value to obtain the final heater value. At step 1324, the data is read/written to that segment/sector with a HMS that is adjusted according to the final heater value.

Figure 14:
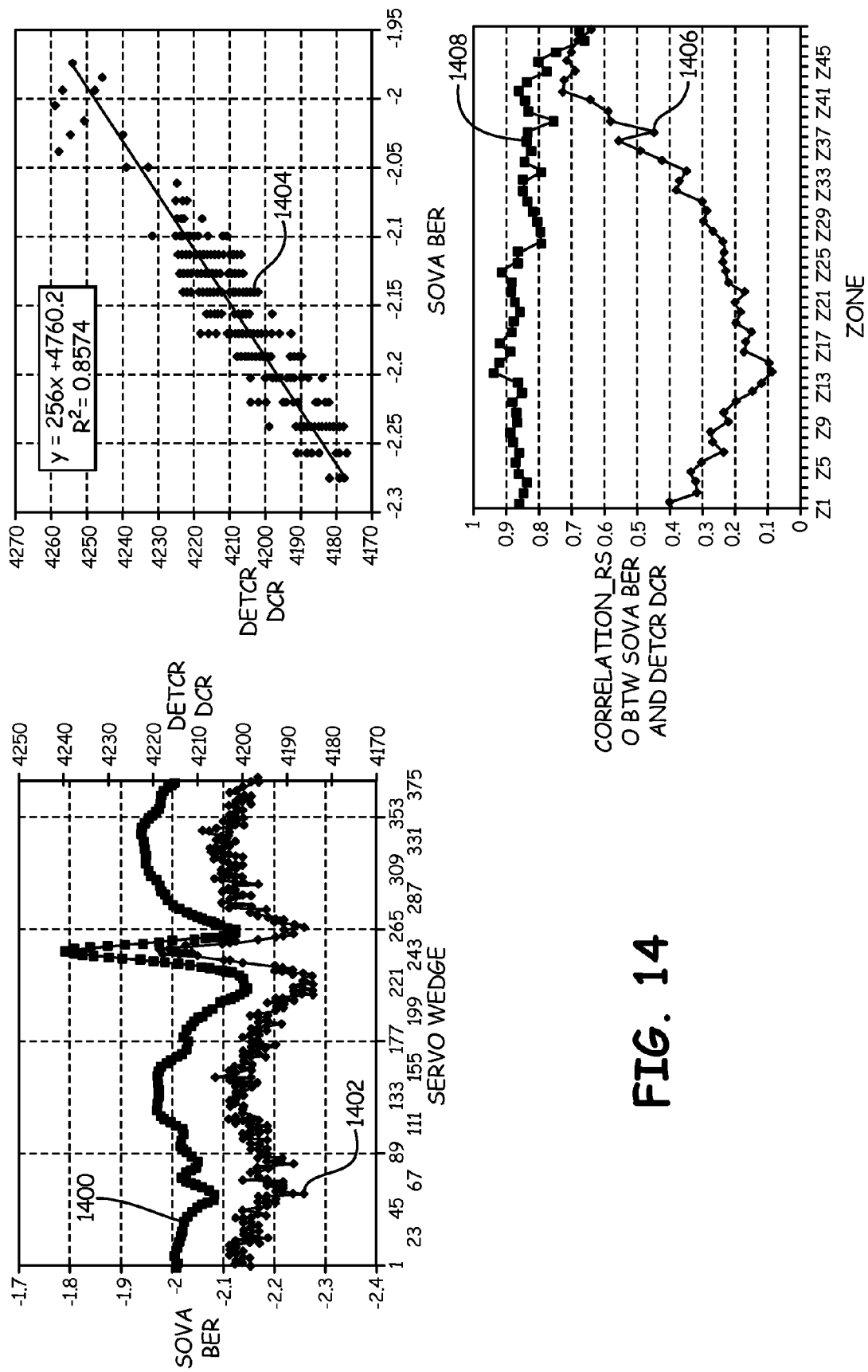
FIG. 14 includes plots related to determining a correlation between BER and topographical profiles.

As noted above, at step 1306, the topographical and BER profiles are compared. In some embodiments, a correlation function that can show whether and how strongly topographical and BER profiles for segments (for example, servo and/or data wedges) are related, is used. In one embodiment, a correlation parameter, denoted by R and described below in connection with FIG. 14, is used to measure an amount of linear association between the topographical and BER profiles. R is always between −1 and 1 inclusive. In a particular embodiment, R-squared (RSQ or $R^2$), which is the square of the correlation parameter, is computed. Plots that include RSQ values and show correlation between SOVA BER and DETCR DCR are shown in FIG. 14. Plot 1400 illustrates variations in SOVA BER over servo wedges of a data storage medium. Plot 1402 illustrates variations in DETCR DCR over the servo wedges of the data storage medium. Plot 1404 is a graph showing correlation between DETCR DCR and SOVA BER. Plots 1406 and 1408 are graphs of correlation RSQ between SOVA BER and DETCR DCR at different zones on the disc surface. Plot 1406 is a graph of correlation values associated with a first head over a first disc surface and plot 1408 is graph of correlation values associated with a second head over a second disc surface. In one embodiment, any segment that has a correlation RSQ value of 0.5 or greater, when the topographical and BER profiles at that segment are compared, is identified as a segment at which a heater offset may be calculated. No heater offsets may by calculated for segments at which the comparisons of the BER and topographical profiles yield correlation RSQ values that are less than 0.5.

Figure 15:
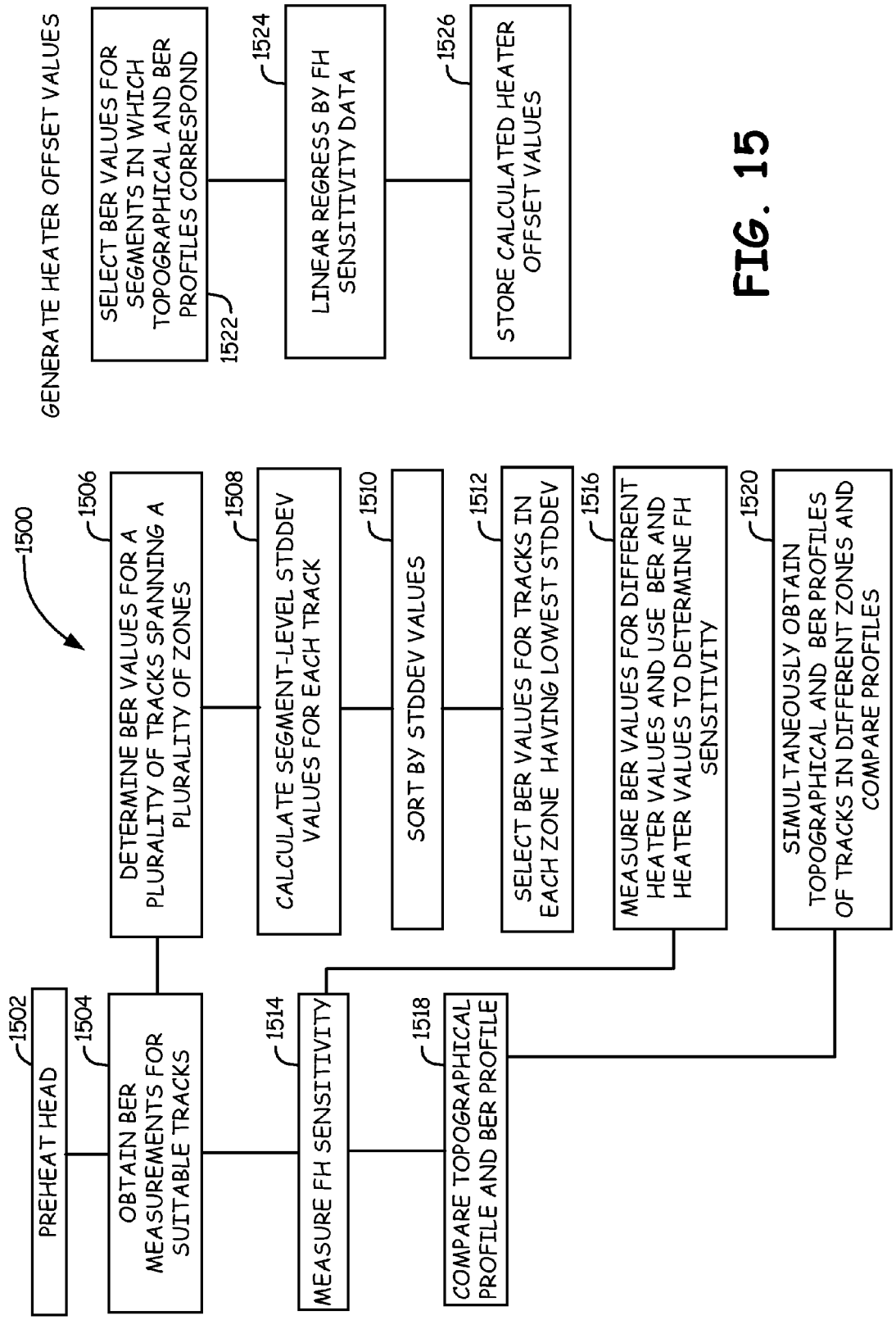
FIG. 15 is a simplified block diagram that includes steps for generating heater offset values in accordance with one embodiment.

As noted above in connection with steps 1308, 1310 and 1312 of FIG. 13, heater offset values (for example, heater DAC values) are calculated for utilization during execution of read/write commands in the data storage device. FIG. 15 is a simplified block diagram 1500 that includes steps for generating such heater offset values in accordance with one embodiment. At step 1502, a head is preheated using a predetermined DAC value, for example. At step 1504, suitable tracks are located on the data storage medium to carry out BER measurements. This may involve selecting groups of tracks in, for example, different zones on a surface of the data storage medium. At step 1506, BER values at each segment of each tack in each of the selected groups of tracks are determined. At step 1508, using the determined segment BER values, segment-level standard deviation (STDEV) values for segments in each of the different tracks are calculated. At step 1510, the calculated STDEV values are sorted. At step 1512, segment BER values of a suitable number of tracks (five, for example) having a lowest STDEV in each respective zone are selected for carrying out additional calculations.

At step 1514, a FH sensitivity is calculated. This may be carried out as shown at step 1516 by measuring BER values for different heater DAC values and dividing changes in the heater DAC values by corresponding changes in the BER values. At step 1518, a topographical profile and a BER profile are compared. This may be carried out as shown at step 1520 by obtaining BER and topographical profiles of tracks in different zones and comparing the profiles. This step may be performed in a read/write channel such as 226 (of FIG. 2). The calculated values obtained in steps 1512, 1516 and 1520 are used for generating heater offset values. At step 1522, BER values for segments in which BER and topographical profiles correspond are selected from the BER values obtained in step 1512. At step 1524, a linear regression analysis, using any suitable technique, is carried out to determine a relationship between BER values obtained at step 1522 and FH sensitivity data determined at step 1516 and, based on the determined relationship, heater offset values are computed. At step 1524, the computed heater offset values are stored in, for example, registers such as 219 (of FIG. 2).

Figure 16:
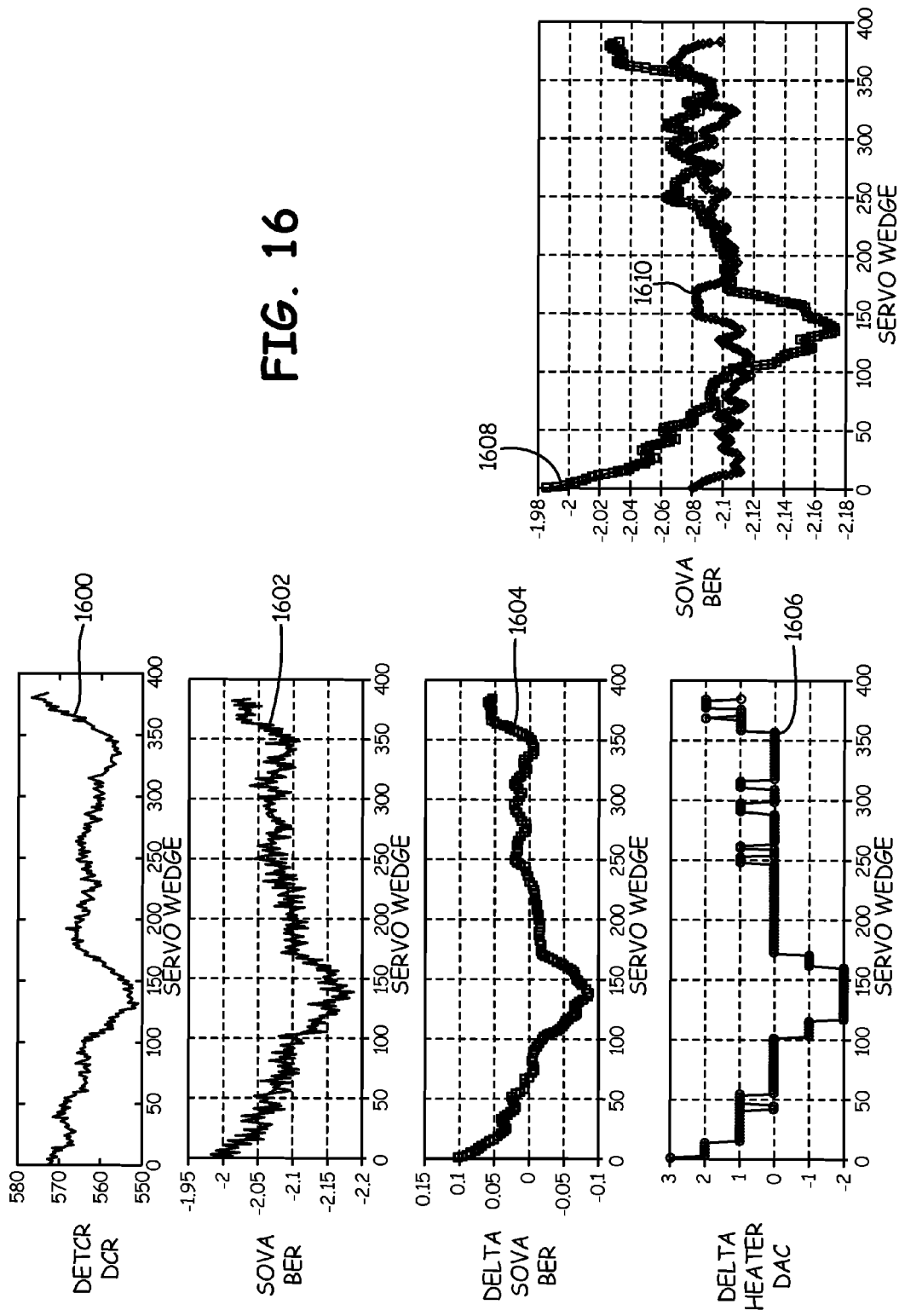
FIG. 16 illustrates plots of data obtained during different stages of the method of FIG. 13.

FIG. 16 shows plots of data obtained during different stages of the method of FIG. 13, and also includes plots that compare experimental data obtained without adjusting head-media spacings for different segments of a disc surface (i.e., before optimization) with data obtained after head-media spacings are adjusted for different segments of the disc (i.e., after optimization). Plot 1600 is a DETCR DCR profile over one disc revolution, and plot 1602 is a SOVA BER profile over the disc revolution. Plots 1604 shows changes in servo BER values that correspond to changes in heater DAC values (plot 1606). Plot 1608 represents BER data obtained before optimization where absolute values of segment BERs are relatively low. After compensation using computed segment-level heater DAC values, segment BERs improve as indicated by the higher absolute BER values in plot 1610.

In accordance with various embodiments, the methods described herein may be implemented as one or more software programs running on one or more microprocessors or controller devices, such as the microprocessor included in data storage device 108. Dedicated hardware implementations including, but not limited to, application specific integrated circuits, programmable logic arrays and other hardware devices can likewise be constructed to implement the methods described herein. Instructions stored on a computer-readable storage device (for example, storage element/storage medium 112), that when executed by a processor device (for example, controller 110) configure the processor device to execute the steps of the methods described herein.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be reduced. Accordingly, the disclosure and the figures are to be regarded as illustrative rather than restrictive.

One or more embodiments of the disclosure may be referred to herein, individually and/or collectively, by the term "invention" merely for convenience and without intending to limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments.

The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. An apparatus comprising:
    a controller device configured to:
        determine a topographical profile of a storage medium and a bit error rate profile of the storage medium;
        utilize a correlation function to determine whether the topographical profile and the bit error rate profile correspond prior to adjusting a read/write operation parameter to substantially avoid potential improper read/write operation parameter adjustments when bit error rate variations occur without corresponding topographical variations;
        detect at least one of the topographical variations or the bit error rate variations amongst different segments of a plurality of segments in the storage medium when the topographical profile and the bit error rate profile correspond; and
        adjust the read/write operation parameter according to the detected topographical variations or bit error rate variations to control bit error rates of the plurality of segments.

2. The apparatus of claim 1, wherein the storage medium comprises a magnetic data storage disc with concentric tracks divided into the different segments that comprise the plurality of segments.

3. The apparatus of claim 2, wherein the read/write operation parameter comprises a write pole tip protrusion.

4. The apparatus of claim 2, wherein each of the plurality of segments is divided into a plurality of sectors.

5. The apparatus of claim 1, wherein the read/write operation parameter comprises a spacing between a recording head and the storage medium.

6. The apparatus of claim 1, wherein the controller device is configured to employ different head-medium spacings for different ones of the plurality of segments based on the detected topographical variations or bit error rate variations.

7. The apparatus of claim 4, wherein the head is a heater-actuated head and wherein the controller device is further configured to calculate heater segment offsets that correspond to the detected topographical variations or bit error rate variations.

8. The apparatus of claim 7, wherein the controller device is further configured to adjust head-medium spacings at different ones of the segments of the plurality of segments based on respective ones of the calculated heater segment offsets.

9. A data storage device comprising:
    a storage element divided into a plurality of segments; and
    a controller device configured to:
        determine a physical profile of the storage element;
        determine a bit error rate profile of the storage element;
        utilize a correlation function to determine whether the physical profile and the bit error rate profile correspond prior to adjusting a read/write operation parameter to substantially avoid potential improper read/write operation parameter adjustments when bit error rate variations occur without corresponding topographical variations;
        detect variations in bit error rates amongst different segments of the plurality of segments in the storage element when the physical profile and the bit error rate profile correspond; and
        adjust the read/write operation parameter according to the detected variations amongst the bit error rates in the plurality of segments.

10. The device of claim 9, wherein the controller device is configured to adjust the read/write operation parameter for a particular one of the plurality of segments only if the physical profile of the storage element and the bit error rate profile of the storage element at the particular one of the plurality of segments correspond.

11. The device of claim 9, wherein the controller device is configured to employ different head-media spacings for different ones of the plurality of segments based on the detected variations in the bit error rates in the plurality of segments.

12. An apparatus comprising:
    a controller configured to:
        determine a topographical profile of a data storage disc and a bit error rate profile of the data storage disc;
        utilize a correlation function to determine whether the topographical profile and the bit error rate profile correspond prior to adjusting an operation parameter to substantially avoid potential improper operation parameter adjustments when bit error rate variations occur without corresponding topographical variations;
        detect at least one of the topographical variations or the bit error rate variations amongst different segments of a plurality of segments in the data storage disc when the topographical profile and the bit error rate profile correspond; and adjust the operation parameter according to the detected topographical variations or bit error rate variations to control bit error rates in the plurality of segments.

13. The apparatus of claim 12, wherein the operation parameter is a spacing between a recording head and the data storage disc.

14. The apparatus of claim 13, wherein the disc comprises concentric tracks divided into the different segments that comprise the plurality of segments.

15. The apparatus of claim 14, wherein each of the plurality of segments is divided into a plurality of sectors.

16. The apparatus of claim 15, wherein the controller is configured to determine sector bit error rates for individual ones of the plurality of sectors and configured to compute the bit error rates of the segments from the sector bit error rates.

17. The apparatus of claim 16, wherein the controller is further configured to identify a segment of the plurality of segments having a highest bit error rate of the bit error rates of the segments.

18. The apparatus of claim 17, wherein the controller is further configured to calculate differences between the highest bit error rate and the bit error rates of the segments of the plurality of segments other than the segment with the highest bit error rate.

19. The apparatus of claim 18 and wherein the controller is further configured to adjust the operation parameter based on the calculated differences between the highest bit error rate and the bit error rates of the segments of the plurality of segments other than the segment with the highest bit error rate.

* * * * *